(12) United States Patent
Inaba et al.

(10) Patent No.: US 6,650,590 B2
(45) Date of Patent: Nov. 18, 2003

(54) SEMICONDUCTOR MEMORY DEVICE WITH REDUCED ITS CHIP AREA AND POWER CONSUMPTION

(75) Inventors: Tsuneo Inaba, Kamakura (JP); Fumihiro Kohno, Yokohama (JP); Kenji Tsuchida, Kawasaki (JP); Toshimi Ikeda, Yokohama (JP)

(73) Assignees: Kabushiki Kaisha Toshiba, Tokyo (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/103,141

(22) Filed: Mar. 22, 2002

(65) Prior Publication Data

US 2002/0141277 A1 Oct. 3, 2002

(30) Foreign Application Priority Data

Mar. 29, 2001 (JP) ........................................ 2001-095967

(51) Int. Cl.$^7$ ................................................ G11C 7/00
(52) U.S. Cl. ................... 365/226; 365/189.11; 365/227
(58) Field of Search ........................ 365/230.06, 230.01, 365/189.11, 226, 189.12, 227, 240

(56) References Cited

U.S. PATENT DOCUMENTS

| 5,793,695 | A | * | 8/1998 | Kohno | ................... 365/230.06 |
| 5,825,714 | A | * | 10/1998 | Kohno | ................... 365/230.06 |
| 5,901,083 | A | | 5/1999 | Atsumi et al. | |
| 5,936,432 | A | * | 8/1999 | Oh et al. | ........................ 327/55 |
| 6,144,582 | A | | 11/2000 | Atsumi et al. | |
| 6,215,692 | B1 | * | 4/2001 | Kang | ......................... 365/145 |
| 6,252,801 | B1 | | 6/2001 | Atsumi et al. | |

FOREIGN PATENT DOCUMENTS

JP            11086543           3/1999

* cited by examiner

Primary Examiner—Thong Le
(74) Attorney, Agent, or Firm—Banner & Witcoff, Ltd.

(57) ABSTRACT

One (first level shift circuit) of first and second level shift circuits is provided in a local word-drive-line driving circuit located near memory cell arrays. The second level shift circuit is provided in a global word-drive-line driving circuit located remote from the memory cell arrays.

23 Claims, 10 Drawing Sheets

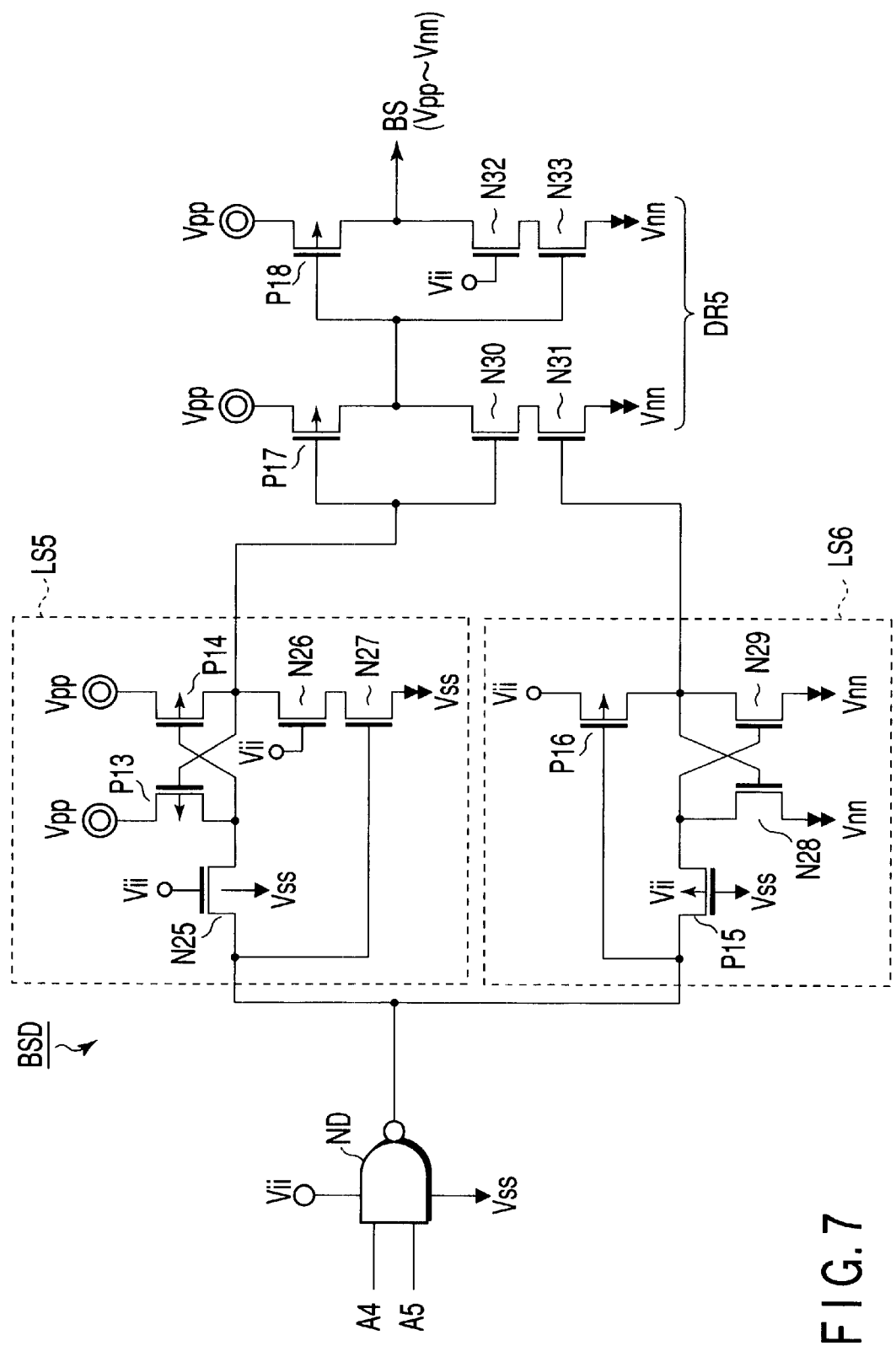
F I G. 7

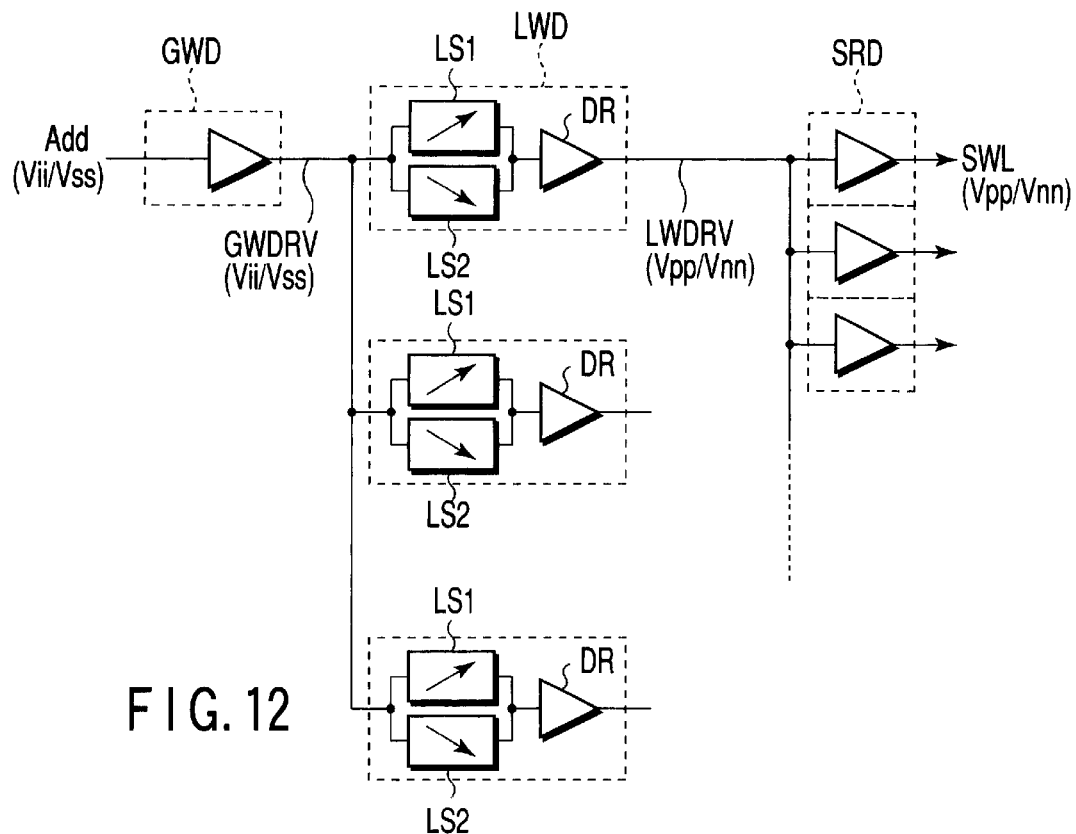
F I G. 12
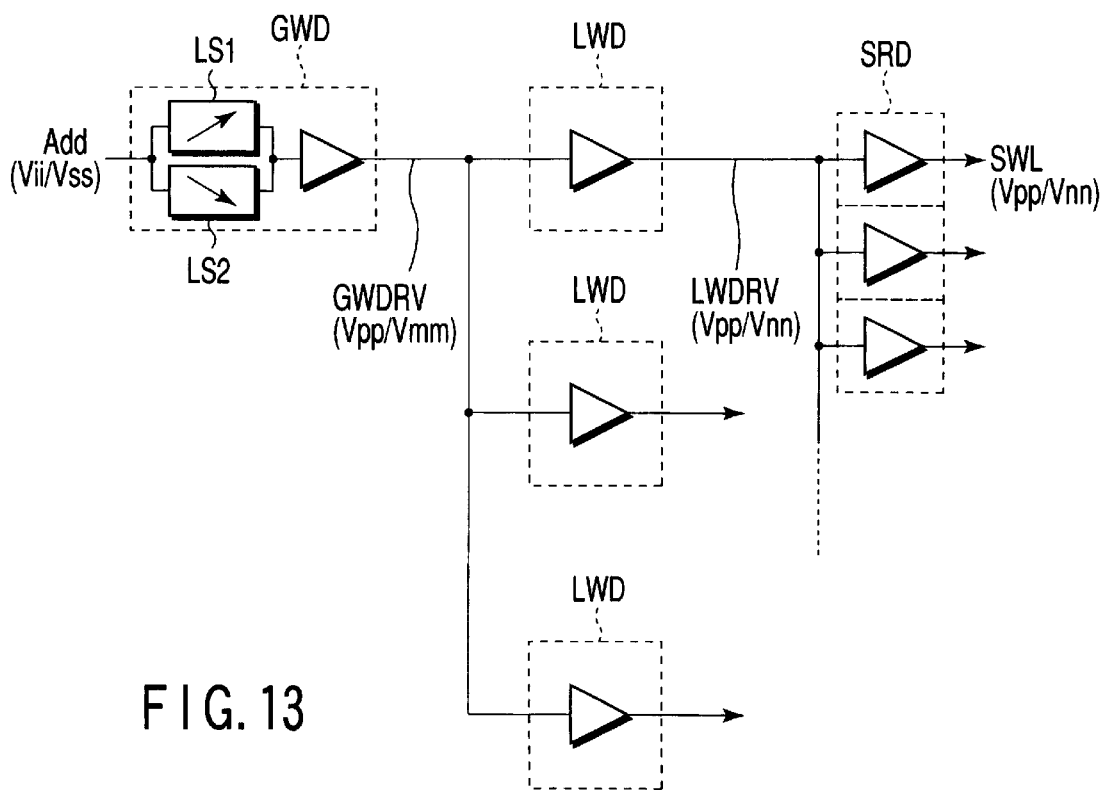
F I G. 13

SEMICONDUCTOR MEMORY DEVICE WITH REDUCED ITS CHIP AREA AND POWER CONSUMPTION

CROSS-REFERENCE TO RELATED APPLICATIONS

This application is based upon and claims the benefit of priority from the prior Japanese Patent Application No. 2001-095967, filed Mar. 29, 2001, the entire contents of which are incorporated herein by reference.

BACKGROUND OF THE INVENTION

1. Field of the Invention

The present invention relates to a semiconductor memory device such as a dynamic RAM (hereinafter referred to as a "DRAM"), and more particularly to a circuit for driving word lines.

2. Description of the Related Art

Recently, semiconductor memory devices have been microfabricated. In particular, DRAMs have an ultra-minute structure and operate on reduced power supply voltages. However, the threshold voltage of cell transistors of a DRAM cannot be reduced, as a leak current (Ioff), which flows when each cell transistor is not selected, is also reduced. This makes it difficult to scale the thickness of the gate oxide film of each cell transistor. In light of this, the thinning of the gate oxide film is realized, using, for example, a material with a high breakdown voltage. However, since the electric field (Eox) applied to the gate oxide film is not less than 6 MV/cm at present, the conventional method is approaching its limits.

To solve the problem, a so-called negative-word-line-reset (NWR) method is now being proposed. In this method, the word-line reset potential is set lower than the low level of bit lines (i.e. the potential used to write "0" data). Further, the gate-source potential Vgs is less than 0. Accordingly, the threshold voltage can be reduced, with the leak current Ioff kept low.

In the NWR method, when the bit-line potential varies between Vaa and Vss (Vaa>Vss(ground potential)), the word-line potential varies between a boosted voltage Vpp and a negative voltage Vnn (the reset potential of the word lines) (Vpp>Vnn, Vnn>Vss, Vpp>Vaa). This means that the word-line driving circuit needs a level shift circuit for generating, from a power supply voltage, the boosted voltage Vpp higher than the power supply voltage, and another level shift circuit for generating the negative voltage Vnn from the power supply voltage.

FIG. 11 schematically shows the core section of a standard DRAM configured for NWR. A plurality of memory cell arrays MCA have their respective segment word lines SWL and bit lines BL. A memory cell MC is provided at each intersection of the segment word lines SWL and bit lines BL. In other words, each memory cell array MCA includes a plurality of memory cells MC arranged in a matrix.

Segment-row-decoder groups SRD for selecting the segment word lines SWL are arranged at the opposite ends of the segment row lines SWL of each memory cell array MCA. Each segment-row-decoder group includes a plurality of segment row decoders (not shown) corresponding to the number of segment word lines. Further, a plurality of sense amplifiers S/A are arranged at the opposite ends of the bit lines of each memory cell array MCA. The potential of the bit lines BL is amplified by the sense amplifiers S/A.

A local word-drive-line driving circuit LWD and various driving circuits (not shown), etc. are provided in each intersection area (hereinafter referred to as an "SSC") between the sense amplifiers S/A and the segment-row-decoder groups SRD. A plurality of local word drive lines LWDRV are connected to the local word-drive-line driving circuit LWD. The local word drive lines LWDRV are driven by the local word-drive-line driving circuit LWD, whereby they are connected to the respective row decoders of a corresponding segment-row-decoder group SRD.

A plurality of main word lines MWL are provided above those of the memory cell arrays MCA, which are arranged along the segment word lines SWL. The main word lines MWL are connected to main-row-decoder groups MRD arranged to correspond to the segment-row-decoder groups SRD. Each main-row-decoder group MRD includes a plurality of main row decoders. Each main row decoder selects a corresponding one of the main word lines MWL. In other words, the main word lines MWL are driven by the respective main row decoders of each main row decoder group WRD, whereby they are connected to the respective segment row decoders of each segment row decoder group SRD. The segment word lines SWL are driven by the respective segment row decoders, whereby they are connected to the respective memory cells of each memory cell array MCA. The area selected by each main decoder group MRD forms one block.

A block-select-line driving circuit BSD, for example, is provided in an area SMC located adjacent to each intersection area SSC between corresponding main row decoder groups MRD. The block-select-line driving circuit BSD is connected to a block select line BS. Each block select line BS is provided above corresponding intersection areas SSC and sense amplifiers S/A arranged in the direction of the segment word lines SWL. The block select lines BS are driven by the respective block-select-line driving circuits BSD, whereby they are connected to the respective local word-drive-line driving circuits LWD.

A column select line CSL is provided corresponding to those of the sense amplifiers S/A, which are arranged in the direction of each bit line BL. One end of each column select line CSL is connected to a column-select-line driving circuit CSLD. The column-select-line driving circuit CSLD is provided in each of areas AMP. A data-line sense amplifier (not shown), for example, is provided in each area AMP.

A global word-drive-line driving circuit GWD is provided in an area ASC, which is located adjacent to each intersection area SSC between corresponding areas AMP. A global word drive line GWDRV is connected to each global word-drive-line driving circuit GWD. The global word drive line GWDRV is provided corresponding to those of the intersection areas SSC and segment row decoders SRD, which are arranged in the direction of each bit line BL. The global word drive line GWDRV is connected to each global word-drive-line driving circuit GWD in a corresponding intersection area SSC. Further, various control circuits and/or driving circuits are provided in each area ASC.

As described above, in the NWR method, the potential of the segment word lines SWL is set at Vpp or Vnn. However, if the potential of an address signal or a control signal supplied from a peripheral circuit to the core section is set at Vpp or Vnn, the consumption of power, for example, may increase. Therefore, it is not preferable to set such a potential range. In light of this, these signals are generally set at an internal power supply voltage Vii or Vss. In the NWR method, the core section needs a level shift circuit for converting the internal power supply voltage Vii or Vss into the potential Vpp or Vnn.

In the circuit shown in FIG. 11, the level shift circuit only converts the internal power supply voltage Vii or Vss into the voltage Vpp or Vss. This being so, the level shift circuit is provided only in the local word-drive-line driving circuit LWD that is provided in each intersection area SSC.

FIG. 12 schematically shows a word line driving system example in a DRAM. The global word-drive-line driving circuit GWD drives the global word drive line GWDRV in accordance with an address signal Add (of the internal power supply voltage Vii or ground voltage Vss). The high and low levels of the global word drive line GWDRV are the internal power supply voltage Vii and the ground voltage Vss, respectively.

Each local word-drive-line driving circuit LWD includes first and second level shift circuits LS1 and LS2 and a driving circuit DR. The first level shift circuit LS1 boosts the internal power supply voltage Vii into Vpp, while the second level shift circuit LS2 converts the ground voltage Vss into the negative voltage Vnn. The driving circuit DR drives the local word drive line WDRV in accordance with output signals from the first and second level shift circuits LS1 and LS2. The high and low levels of the local word drive line LWDRV are the boosted voltage Vpp and the negative voltage Vnn, respectively.

Each segment row decoder SRD drives a corresponding segment word line SWL in accordance with the level of the local word drive line LWDRV. The high and low levels of each segment word line are the boosted voltage Vpp and the negative voltage Vnn, respectively.

As described above, in the case of using the NWR method, each segment word line SWL is set at the boosted voltage Vpp or the negative voltage Vnn. To set each segment word line SWL at Vpp or Vnn, it is necessary to set the local word drive line LWDRV at Vpp or Vnn. To this end, as shown in FIG. 12, each local word-drive-line driving circuit LWD is located near corresponding ones of the segment word lines SWL that use voltages Vpp and Vnn.

In general, memory cell arrays occupy the largest area in each DRAM, and the aforementioned core circuit occupies the second largest area. The sense amplifiers and segment row decoders are arranged in the core circuit. Although each sense amplifier or segment row decoder has a small area, the entire core circuit requires a large area, since the sense amplifiers and segment row decoders are arranged cyclically in the core circuit. From this, it is evident that the area reduction of each sense amplifier and segment row decoder is very effective in reducing the chip area.

However, in the case of reducing the areas of each sense amplifier and segment row decoder, the area of each intersection SSC is also inevitably reduced. This makes it very difficult to provide the first and second level shift circuits LS1 and LS2 and driving circuit DR in the local word-drive-line driving circuit LWD that is located in each intersection SSC.

FIG. 13 schematically shows another word driving system example in a DRAM. In FIG. 13, the first and second level shift circuits LS1 and LS2 are provided in the global word-drive-line driving circuit GWD, and only the driving circuit DR is provided in the local word-drive-line driving circuit LWD. This configuration enables the provision of the local word-drive-line driving circuit LWD in a small intersection area SSC.

However, the global word drive line GWDRV is long, as shown in FIG. 11, and hence has a large wiring capacity. Accordingly, much power is required to drive the global word drive line GWDRV at the boosted voltage Vpp or the negative voltage Vnn, with the result that the power consumption is increased. Therefore, there is a need for reducing the chip area and suppressing the consumption of power of a semiconductor memory device.

BRIEF SUMMARY OF THE INVENTION

According to an aspect of the present invention, there is provided a semiconductor memory device comprising: a first circuit configured to generate a second signal in accordance with a first signal, the first signal having high and low levels set at first and second voltages, respectively, the second signal having high and low levels set at the first voltage and a third voltage lower than the second voltage, respectively; and a plurality of second circuits connected to the first circuit, each of the second circuits being configured to generate a third signal in accordance with the second signal output from the first circuit, the third signal having high and low levels set at a fourth voltage higher than the first voltage and the third voltage, respectively, wherein: the first circuit includes a first level shift circuit which converts the second voltage into the third voltage; and the second circuit includes a second level shift circuit which converts the first voltage into the fourth voltage.

BRIEF DESCRIPTION OF THE SEVERAL VIEWS OF THE DRAWING

FIG. 7 is a circuit diagram illustrating an example of a block-select-line driving circuit BSD appearing in FIG. 2;

FIG. 12 is a schematic view illustrating an example of a word-line driving system in the DRAM; and FIG. 13 is a schematic view illustrating another example of the word-line driving system in the DRAM.

DETAILED DESCRIPTION OF THE INVENTION

The embodiments of the present invention will be described with reference to the accompanying drawings.

First Embodiment

Figure 1:
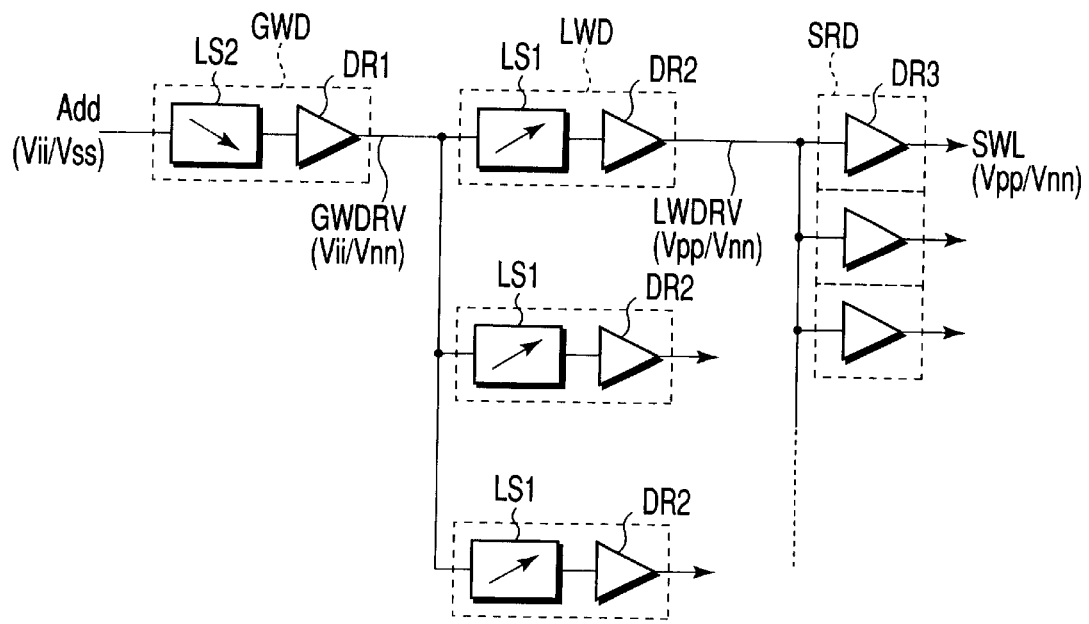
FIG. 1 is a diagram illustrating the configuration of a first embodiment of the invention.

For facilitating the description, FIG. 1 only shows an essential part of a first embodiment of the invention. In FIGS. 1 and 11–13, like reference numerals denote like elements.

In FIG. 1, a global word-drive-line driving circuit GWD comprises a second level shift circuit LS2 and a driving circuit DR1. An address signal Add is supplied to the input terminal of each global word-drive-line driving circuit GWD. The high and low levels of the address signal are an internal power supply voltage Vii and a ground voltage Vss, respectively. The second level shift circuit LS2 converts the voltage Vii or Vss into Vii or Vnn. The driving circuit DR1 drives the global word-drive-line driving circuit GWD in accordance with a voltage output from the second level shift circuit LS2. In other words, the driving circuit DR1 applies the voltage Vii or Vnm to a global word drive line GWDRV to drive it. The global word drive line GWDRV is connected to a plurality of local word-drive-line driving circuits LWD.

The local word-drive-line driving circuits LWD are provided in respective intersection areas SSC. Each local word-drive-line driving circuit LWD includes a first level shift circuit LS1 and a driving circuit DR2. Each local word-drive-line driving circuit LWD drives corresponding local word drive lines LWDRV in accordance with the potential of the global word drive line GWDRV. Specifically, each first level shift circuit LS1 converts the voltage Vii or Vnn to the voltage Vpp or Vnn. Each second driving circuit DR2 drives a corresponding local word drive line LWDRV in accordance with a voltage output from a corresponding first level shift circuit LS1. Accordingly, each local word drive line LWDRV is driven by a corresponding driving circuit DR2 at the boosted voltage Vpp or the negative voltage Vnn. Each local word drive line LWDRV is connected to a plurality of segment row decoders SRD.

Each segment row decoder SRD includes a driving circuit DR3. Each driving circuit DR3 drives a corresponding segment word line SWL in accordance with the level of a corresponding local word drive line LWDRV. The high and low levels of each segment word line SWL are the boosted voltage Vpp and the negative voltage Vnn, respectively.

In the above-described first embodiment, only the first level shift circuit LS1, which is included in the first and second level shift circuits LS1 and LS2 required in a word-line driving circuit using the NWR method, is provided in each local word-drive-line driving circuit LWD. Further, the second level shift circuit LS2 is provided in each global word-drive-line driving circuit GWD, and is commonly used by a plurality of local word-drive-line driving circuits LWD. Accordingly, each local word-drive-line driving circuit LWD can be formed of a small-scale circuit, resulting in the reduction of its layout area. This means that the size of each intersection area SSC can be reduced, thereby preventing an increase in required chip area.

Moreover, in general, the ratio of the boosted voltage Vpp to the internal power supply voltage Vii is higher than the ratio of the negative voltage Vnn to the ground voltage Vss. In other words, the first level shift circuit LS1 provides a higher boosting ratio than the second level shift circuit LS2. The consumption of power increases in proportion to the square of a potential amplitude. Therefore, a signal with the voltage Vii or Vnn is of a smaller power consumption than a signal with the voltage Vpp or Vss. A single global word drive line GWDRV is connected to a plurality of local word-drive-line driving circuits LWD. Accordingly, each global word drive line GWDRV is long and of a high wiring capacity, which means that it consumes a large amount of power when it is driven. Therefore, the power, consumed when the second level shift circuit LS2 is provided in each global word drive line GWDRV, and the potential of each global word drive line GWDRV is set at Vii or Vnn, is lower than when the first level shift circuit LS1 is provided in each global word drive line GWDRV, and the potential of each global word drive line GWDRV is set at Vpp or Vss.

Moreover, the first level shift circuit LS1, which provides a higher boosting ratio, is provided in each local word-drive-line driving circuit LWD located close to corresponding memory cell arrays MCA, while the second shift circuit LS2, which provides a lower boosting ratio, is provided in each global word-drive-line driving circuit GWD located remote from corresponding memory cell arrays MCA. This configuration can reduce the number of circuits that require a high voltage. Accordingly, the number of elements of a high breakdown voltage and a large size can be reduced, and hence a high reduction effect of the layout area can be achieved.

In addition, the boosted voltage Vpp and negative voltage Vnn are generated by respective charge pump circuits provided in the chip. Therefore, only a low current is required to generate the voltages Vpp and Vnn, and hence a low current supply is required for each charge pump circuit. This means that the area required for each charge pump circuit can be reduced, thereby reducing the chip size.

Further, when comparing the first embodiment to the case shown in FIG. 12 where both the first and second level shift circuits LS1 and LS2 are provided in each local word-drive-line driving circuit LWD, the first embodiment provides the following advantage. The capacitance of each local word drive line LWDRV includes, for example, a diffusion layer capacitance (junction capacitance) in a corresponding segment row decoder SRD, as well as its own wiring capacitance. Thus, each local word drive line LWDRV has a relatively large wiring capacitance. On the other hand, the capacitance of each global word drive line GWDRV substantially consists of its own wiring capacitance. Furthermore, each global word drive line GWDRV is formed of a wiring layer provided above the local word drive lines LWDRV, and its wiring capacitance is small. Accordingly, an increase in power consumption due to an increase in the potential amplitude of each global word drive line GWDRV is small.

Second Embodiment

Figure 2:
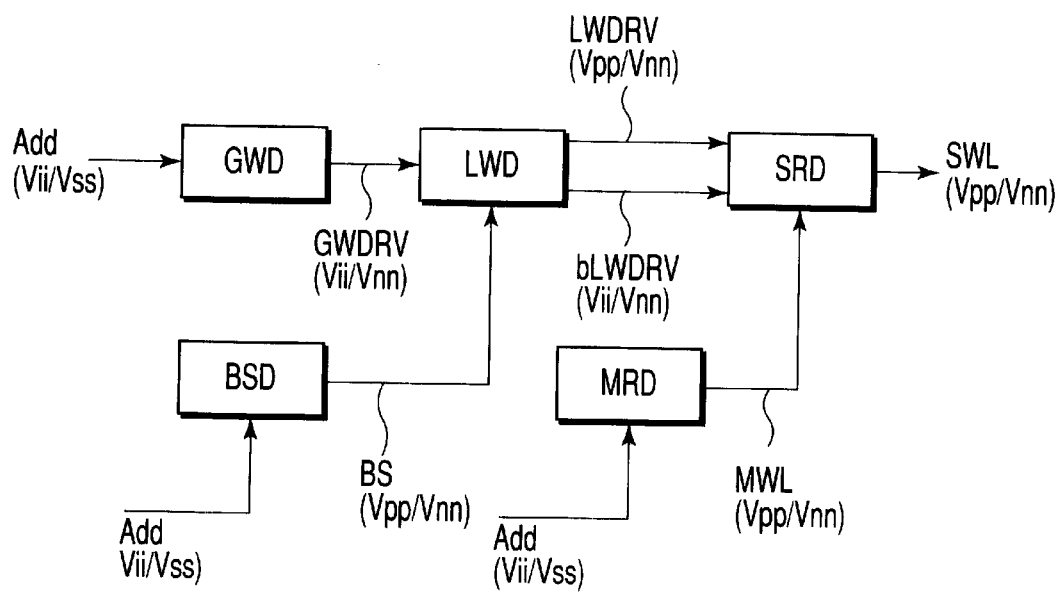
FIG. 2 is a diagram illustrating the configuration of a second embodiment of the invention.

FIG. 2 illustrates an essential part of a second embodiment of the present invention. The configuration shown in FIG. 2 is obtained by adding a block-select-line driving circuit BSD and main row decoder groups MRD to the configuration of FIG. 1. In the second embodiment, reference numerals corresponding to those used in the first embodiment denote similar elements. For facilitating the explanation, in FIG. 2, each of the main row decoder groups MRD, segment row decoder group SRD and local word-drive-line driving circuit LWD, etc. is indicated by a single structural element. Further, MRD and SRD will be referred to simply as a main row decoder and a segment row decoder, respectively.

In FIG. 2, an address signal Add is supplied to the block-select-line driving circuit BSD. The high and low levels of the address signal Add are the internal power supply voltage Vii and the ground voltage Vss, respectively. As described later, the block-select-line driving circuit BSD includes third and fourth level shift circuits LS3 and LS4. The third level shift circuit LS3 shifts the internal power supply voltage Vii to the boosted voltage Vpp, while the fourth level shift circuit LS4 shifts the ground voltage Vss to the negative voltage Vnn.

In this configuration, the block-select-line driving circuit BSD drives a block select line BS in accordance with the address signal Add. The high and low levels of the block select line BS are the boosted voltage Vpp and the negative voltage Vnn, respectively.

The block select line BS is connected to the local word-drive-line driving circuit LWD. In accordance with the voltage of the block select line BS, the local word-drive-line driving circuit LWD drives local word drive lines LWDRV and bLWDRV corresponding to a selected block.

Further, the address signal Add is supplied to the main row decoder MRD for selecting one of the main word lines MWL. As described later, the main row decoder MRD includes fifth and sixth level shift circuits LS5 and LS6. The fifth level shift circuit LS5 shifts the internal power supply voltage Vii to the boosted voltage Vpp, while the sixth level shift circuit LS6 shifts the ground voltage Vss to the negative voltage Vnn. In accordance with the address signal Add, the main row decoder MRD drives the main word line MWL. The high and low levels of the main word line MWL are the boosted voltage Vpp and the negative voltage Vnn, respectively.

The main word line MWL is connected to the segment row decoder SRD. In accordance with the voltage of the main word line MRD, the segment row decoder drives a segment word line SWL.

As aforementioned, in the core section, the sense amplifiers S/A, segment row decoders SRD and intersection areas SSC are arranged two-dimensionally cyclically. On the other hand, the main row decoders MRD and block-select-line driving circuits BSD are arranged one-dimensionally cyclically. This being so, the influence of the main row decoders MRD and block-select-line driving circuits BSD upon the entire chip area is smaller than that of the sense amplifiers S/A, segment row decoders SRD and intersection areas SSC. Consequently, to reduce the required chip area, it is advantageous to concentrically arrange the third to sixth level shift circuits LS3–LS6 in the main row decoders MRD and block-select-line driving circuits BSD.

In particular, since the local word-drive-line driving circuit LWD is formed only of the first level shift circuit LS1, the layout area of the local word-drive-line driving circuit LWD can be minimized, which contributes to the reduction of the chip area.

Figure 3:
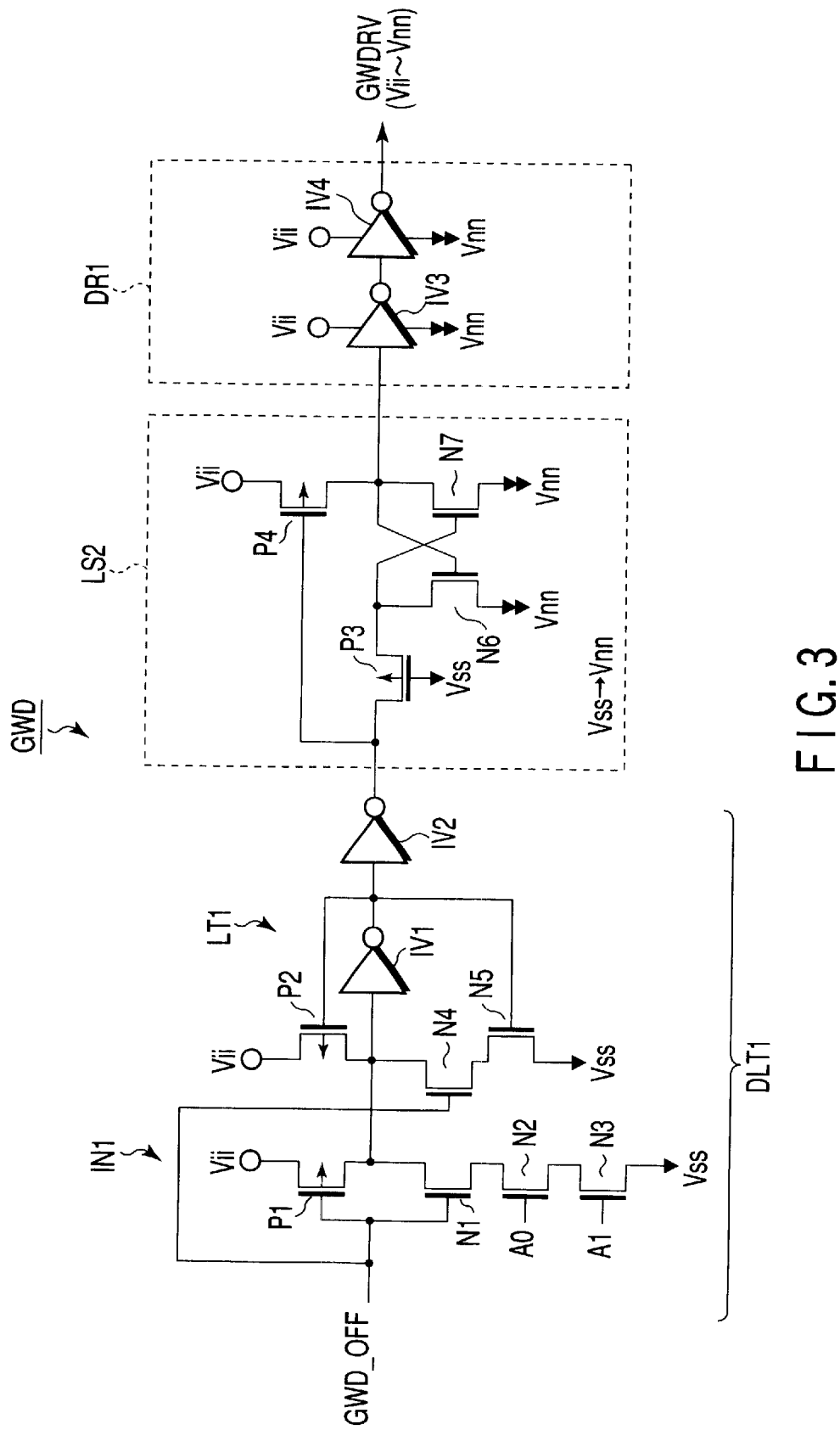
FIG. 3 is a circuit diagram illustrating an example of a global word-drive-line driving circuit GWD appearing in FIG. 2.

FIG. 3 shows a concrete example of the global word-drive-line driving circuit GWD appearing in FIG. 2. As shown, the global word-drive-line driving circuit GWD includes a dynamic latch circuit DLT1, the second level shift circuit LS2 and a driving circuit DR1.

The dynamic latch circuit DLT1 is formed of an input circuit IN1, a latch circuit LT1 and an inverter circuit IV2, and operates at the voltage Vii or Vss. The input circuit IN1 is formed of a P-channel MOS transistor (hereinafter referred to as a "PMOS transistor") P1 and N-channel MOS transistors (hereinafter referred to as "NMOS transistors") N1, N2 and N3. The input circuit IN1 receives address signals A0 and A1 when a control signal GWD_OFF is at the high level.

The latch circuit LT1 is formed of a PMOS transistor P2, NMOS transistors N4 and N5 and an inverter circuit IV1. The latch circuit LT1 receives a signal output from the input circuit IN1 when the control signal GWD_OFF is at the high level, and holds the received signal when the control signal GWD_OFF is at the low level. The output voltage of the latch circuit LT1 is supplied to the second level shift circuit LS2 via the inverter circuit IV2.

The second level shift circuit LS2 is formed of PMOS transistors P3 and P4 and NMOS transistors N6 and N7. The second level shift circuit LS2 operates at the voltage Vii or Vnn and shifts the ground voltage Vss to the negative voltage Vnn. The output voltage of the second level shift circuit LS2 is supplied to the driving circuit DR1.

The driving circuit DR1 is formed of inverter circuits IV3 and IV4 connected in series. The inverter circuits IV3 and IV4 operate at the voltage Vii or Vnn and drive the global word drive line GWDRV. Thus, the global word drive line GWDRV is driven at the voltage Vii or Vnn.

Figure 4:
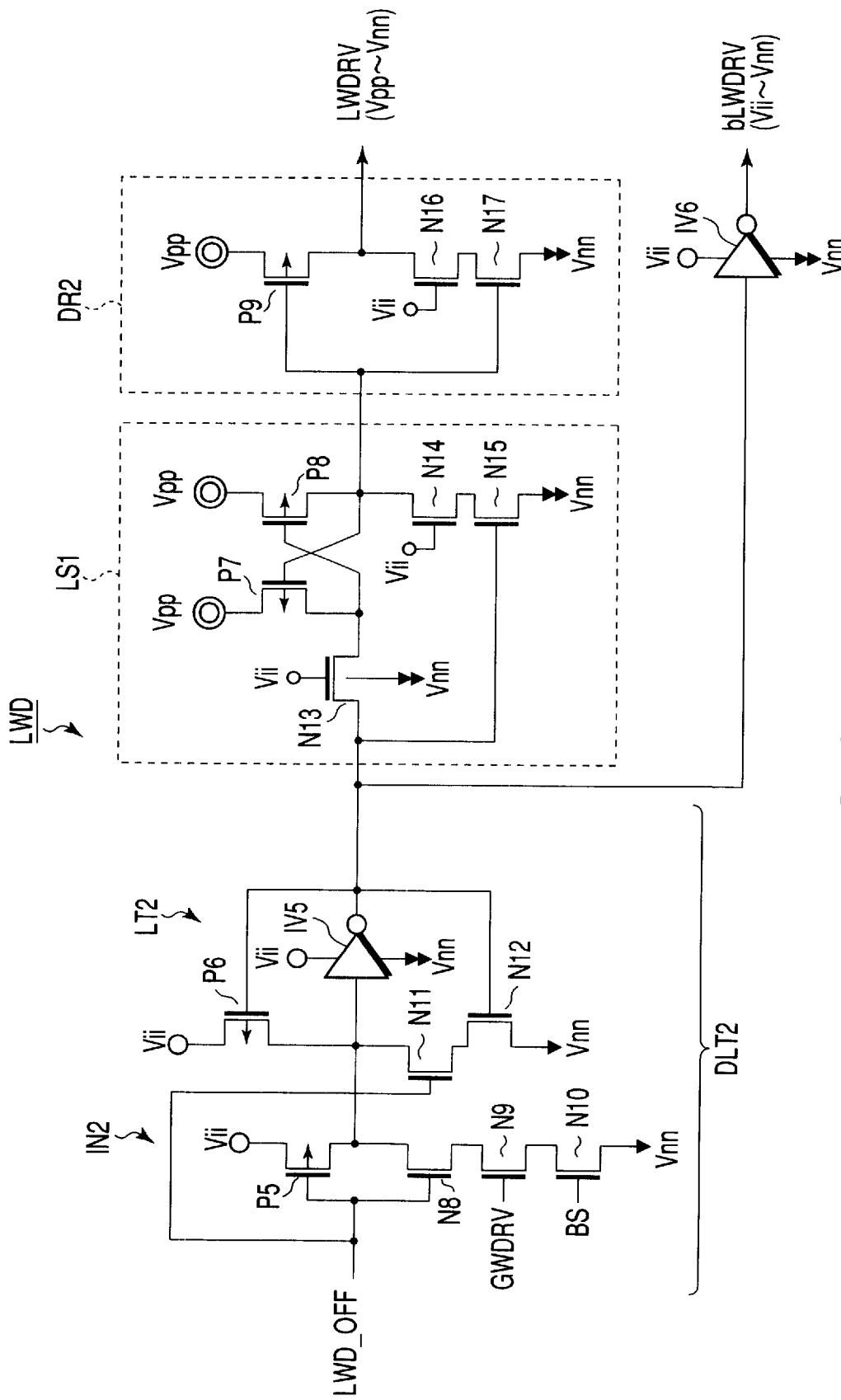
FIG. 4 is a circuit diagram illustrating an example of a local word-drive-line driving circuit LWD appearing in FIG. 2.

FIG. 4 shows a concrete example of the local word-drive-line driving circuit LWD appearing in FIG. 2. As shown, the local word-drive-line driving circuit LWD includes a dynamic latch circuit DLT2, the first level shift circuit LS1, a driving circuit DR2 and an inverter circuit IV6.

The dynamic latch circuit DLT2 is formed of an input circuit IN2 and a latch circuit LT2, and operates at the voltage Vii or Vnn. The input circuit IN2 is formed of a PMOS transistor P5 and NMOS transistors N8, N9 and N10. The input circuit IN2 receives the potentials of the global word drive line GWDRV and block select line BS when a control signal LWD_OFF is at the high level. In other words, the local word-drive-line driving circuit LWD is selected by the logical multiplication of the potentials of the global word drive line GWDRV and block select line BS.

The latch circuit LT2 is formed of a PMOS transistor P6, NMOS transistors N11 and N12 and an inverter circuit IV5. The latch circuit LT2 receives a signal output from the input circuit IN2 when the control signal LWD_OFF is at the high level, and holds the received signal when the control signal LWD_OFF is at the low level. The output voltage of the latch circuit LT2 is supplied to the first level shift circuit LS1.

The first level shift circuit LS1 is formed of PMOS transistors P7 and P8 and NMOS transistors N13, N14 and N15. The first level shift circuit LS1 operates at the voltage Vpp or Vnn and shifts the ground voltage Vss to the negative voltage Vnn. The output voltage of the first level shift circuit LS1 is supplied to the driving circuit DR2.

The driving circuit DR2 is formed of a PMOS transistor P9 and NMOS transistors N16 and N17. The driving circuit DR2 operates at the voltage Vpp or Vnn and drives the local word drive line LWDRV. The potential of the local word drive line LWDRV is Vpp or Vnn.

Furthermore, the input terminal of the inverter circuit IV6 is connected to the output terminal of the latch circuit LT2. The inverter circuit IV6 operates at the voltage Vii or Vnn and drives the other local word drive line bLWDRV. The potential of the local word drive line bLWDRV is Vii or Vnn.

Figure 5:
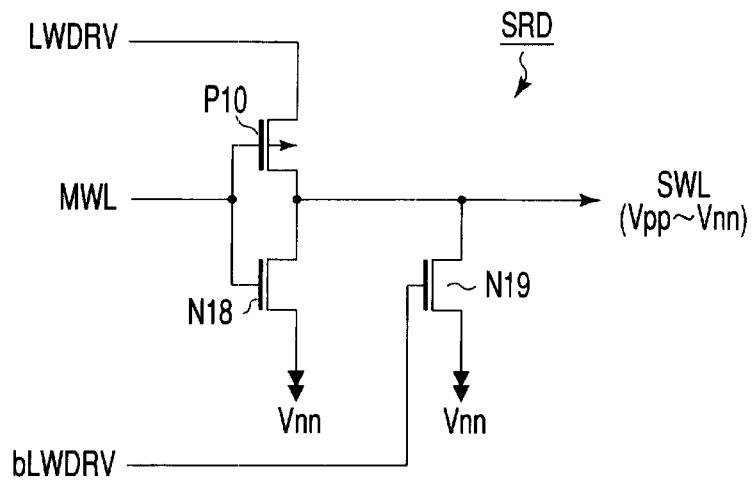
FIG. 5 is a circuit diagram illustrating an example of a segment row decoder SRD appearing in FIG. 2.

FIG. 5 shows a concrete example of the segment row decoder SRD appearing in FIG. 2. As shown, the segment row decoder SRD includes a PMOS transistor P10 and NMOS transistors N18 and N19. The current paths of the PMOS transistor P10 and the NMOS transistor N18 are connected in series between the local word drive line LWDRV and a node to which the negative voltage Vnn is applied. A main word line MWL is connected to the gates of the transistors P10 and N18. The drains of the transistors P10 and N18 are connected to a segment word line SWL, and also to a node, to which the negative voltage Vnn, via an NMOS transistor N19. The gate of the transistor N19 is connected to the local word drive line bLWDRV.

The segment row decoder SRD constructed as above selects a corresponding segment word line SWL on the basis of a signal from the main word line MWL and a signal from the local word drive line LWDRV, and drives the selected segment word line SWL at the voltage Vpp or Vnn.

The NMOS transistor N19 is a so-called noise killer. When the segment word line SWL is not selected, the NMOS transistor N19 is turned on in accordance with the potential of the local word drive line bLWDRV, thereby resetting the segment word line SWL to the negative voltage Vnn.

Figure 6:
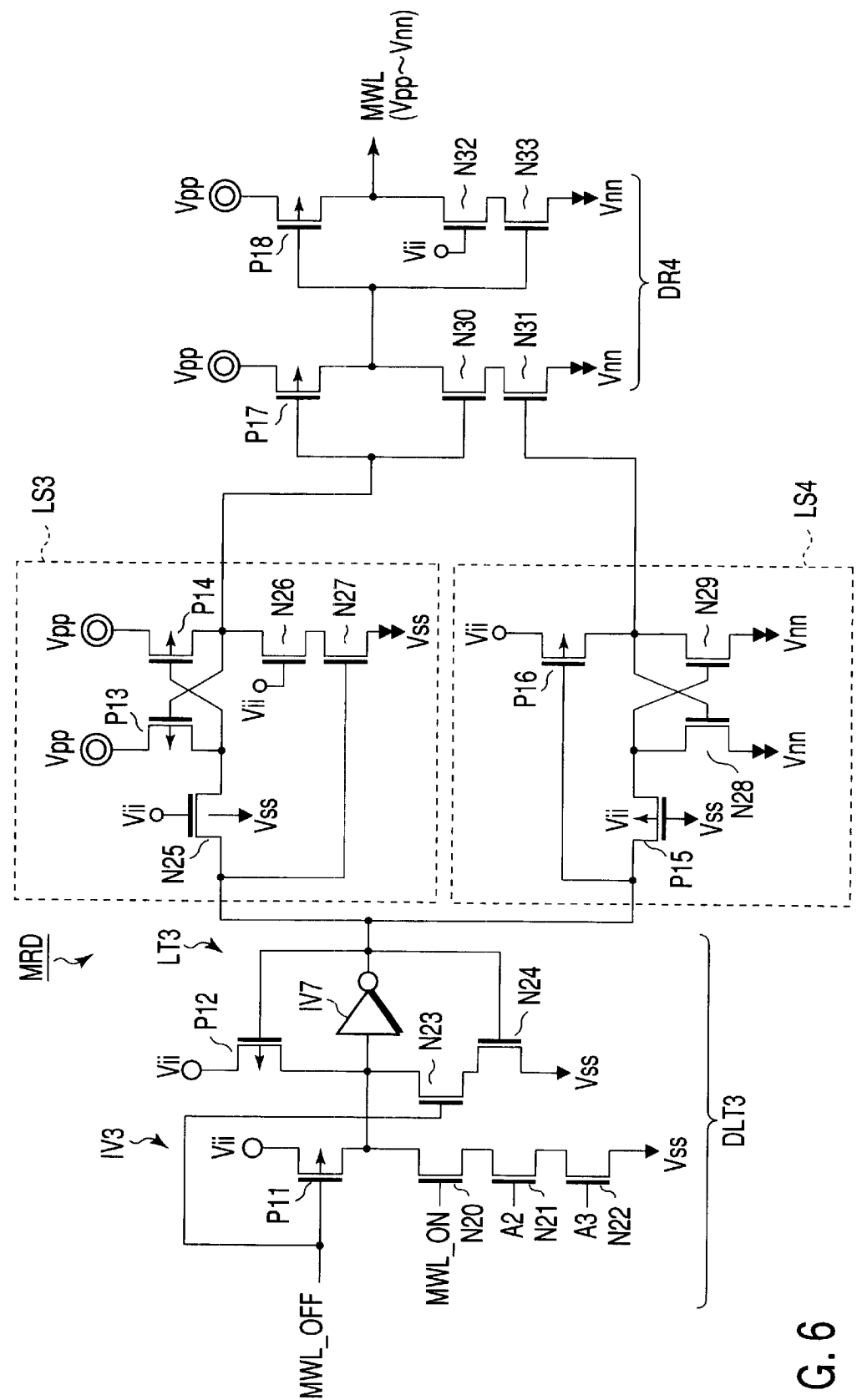
FIG. 6 is a circuit diagram illustrating an example of a main row decoder MRD appearing in FIG. 2.

FIG. 6 shows a concrete example of the main row decoder MRD appearing in FIG. 2. As shown, the main row decoder MRD includes a dynamic latch circuit DLT3, the third level shift circuit LS3, a fourth level shift circuit LS4 and a driving circuit DR4.

The dynamic latch circuit DLT3 is formed of an input circuit IN3 and a latch circuit LT3, and operates at the voltage Vii or Vnn. The input circuit IN3 is formed of a PMOS transistor P11 and NMOS transistors N20, N21 and N22. The input circuit IN3 receives address signals A2 and A3 when a control signal MWL_ON and a control signal MWL_OFF are at the high and low levels, respectively. In other words, the main row decoder MRD is selected by the logical multiplication of the control signal MWL_ON and the address signals A2 and A3.

The latch circuit LT3 is formed of a PMOS transistor P12, NMOS transistors N23 and N24 and an inverter circuit IV7. The latch circuit LT3 receives a signal output from the input circuit IN3 when the control signal MWL_OFF is at the high level, and holds the received signal when the control signal MWL_OFF is at the low level. The output voltage of the latch circuit LT3 is supplied to the third and fourth level shift circuits LS3 and LS4.

The third level shift circuit LS3 is formed of PMOS transistors P13 and P14 and NMOS transistors N25, N26 and N27. The third level shift circuit LS3 operates at the voltage Vpp or Vss and shifts the internal power supply voltage Vii to the boosted voltage Vpp.

The fourth level shift circuit LS4 is formed of PMOS transistors P15 and P16 and NMOS transistors N28 and N29. The fourth level shift circuit LS4 operates at the voltage Vii or Vnn and shifts the ground voltage Vss to the negative voltage Vnn.

The output voltages of the third and fourth level shift circuits LS3 and LS4 are supplied to the driving circuit DR4. The driving circuit DR4 is formed of PMOS transistors P17 and P18 and NMOS transistors N30, N31, N32 and N33. The driving circuit DR4 operates at the voltage Vpp or Vnn and drives the main word line MWL at the voltage Vpp or Vnn.

FIG. 7 shows a concrete example of the block-select-line driving circuit BSD appearing in FIG. 2. As shown, the block-select-line driving circuit BSD includes a NAND circuit ND, the fifth and sixth level shift circuits LS5 and LS6 and a driving circuit DR5.

The NAND circuit ND operates at the voltage Vii or Vss, and has its input terminal supplied with address signals A4 and A5 for selecting a corresponding block. The output signal of the NAND circuit ND is supplied to the fifth and sixth level shift circuits LS5 and LS6. The fifth and sixth level shift circuits LS5 and LS6 have the same configurations as the third and fourth level shift circuits LS3 and LS4, respectively. Therefore, in these circuits, like reference numerals denote like elements, and no explanation is given of the circuits LS5 and LS6. The output voltages of the fifth and sixth level shift circuits LS5 and LS6 are supplied to the driving circuit DR5. The driving circuit DR5 has the same configuration as the driving circuit DR4. Therefore, in these driving circuits, like reference numerals denote like elements, and no explanation is given of the driving circuit DR5. This driving circuit DR drives a corresponding block select line BS. The high and low levels of the block select line are Vpp and Vnn, respectively.

In the above-described second embodiment, the third to sixth level shift circuits LS3–LS6 are concentrically provided in the one-dimensionally-arranged main row decoders MRD and block-select-line driving circuits BSD. Accordingly, an increase in layout area due to the third to sixth level shift circuits LS3–LS6 can be minimized, thereby reducing the required chip area.

Figure 8:
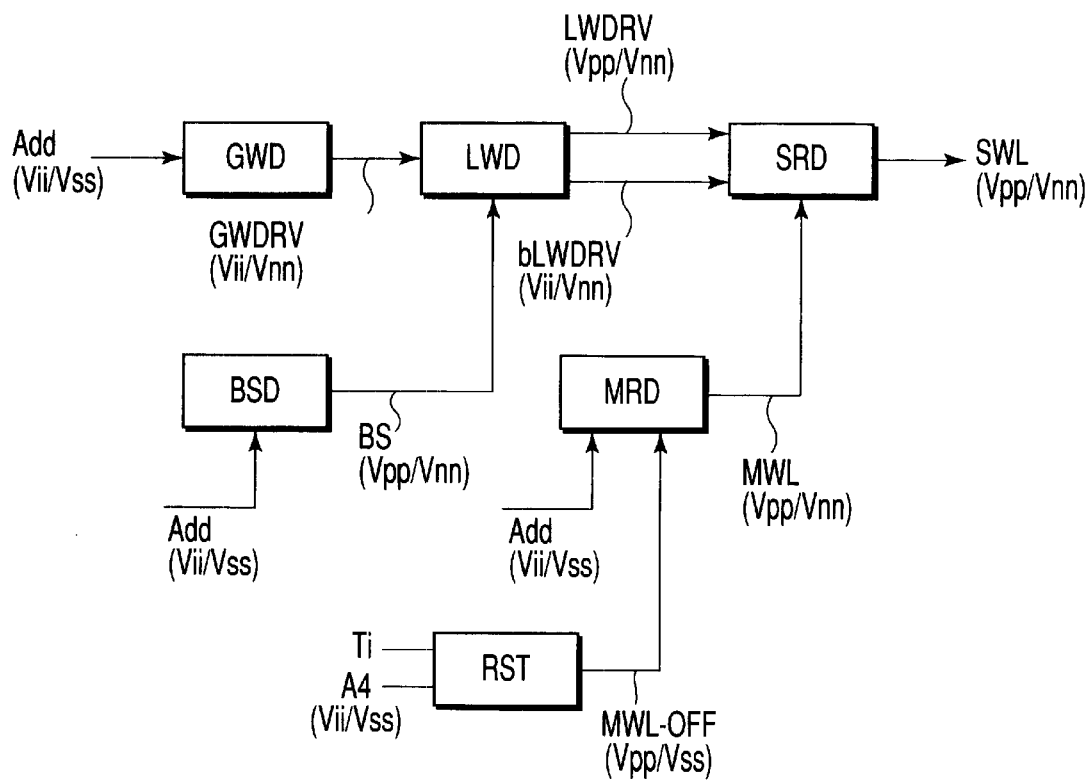
FIG. 8 is a diagram of a modification of the configuration of FIG. 2, illustrating a main row decoder MRD.
Figure 9:
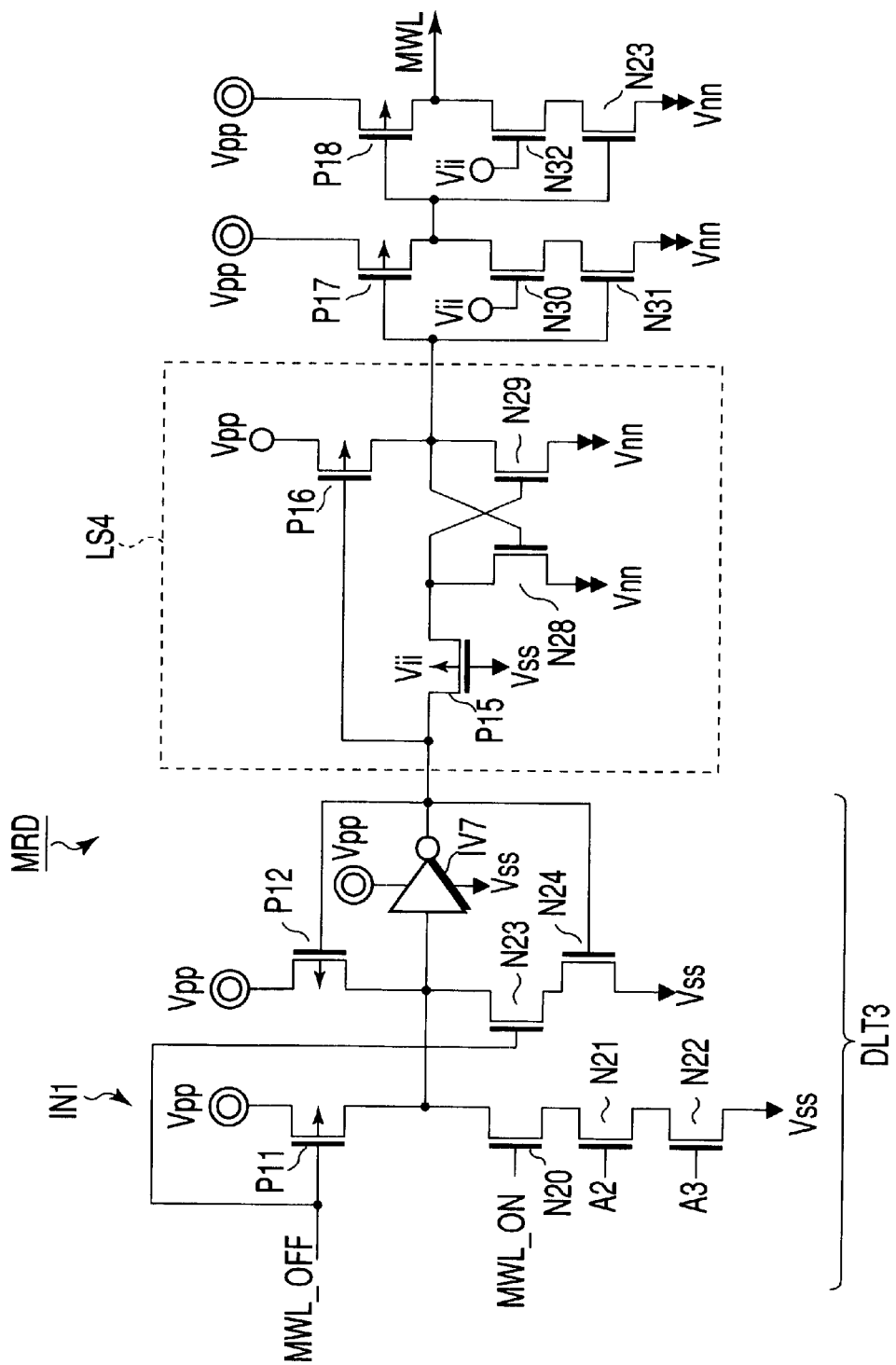
FIG. 9 is a circuit diagram illustrating another example of the main row decoder MRD.
Figure 10:
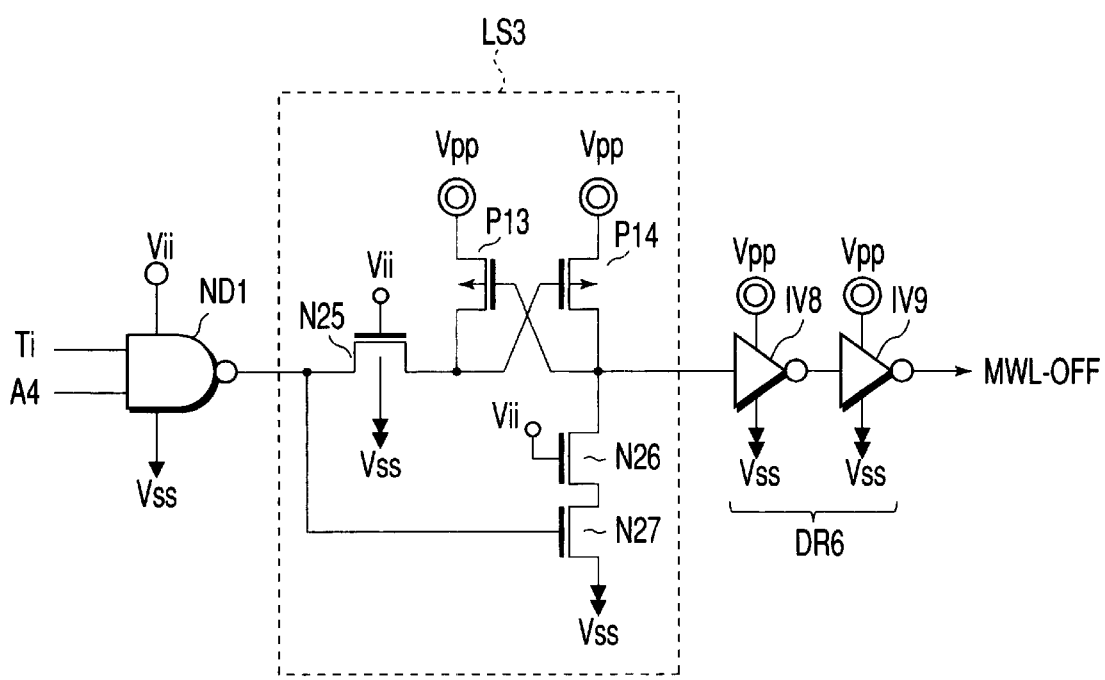
FIG. 10 is a circuit diagram illustrating an example of a reset circuit RST appearing in FIG. 8.
Figure 11:
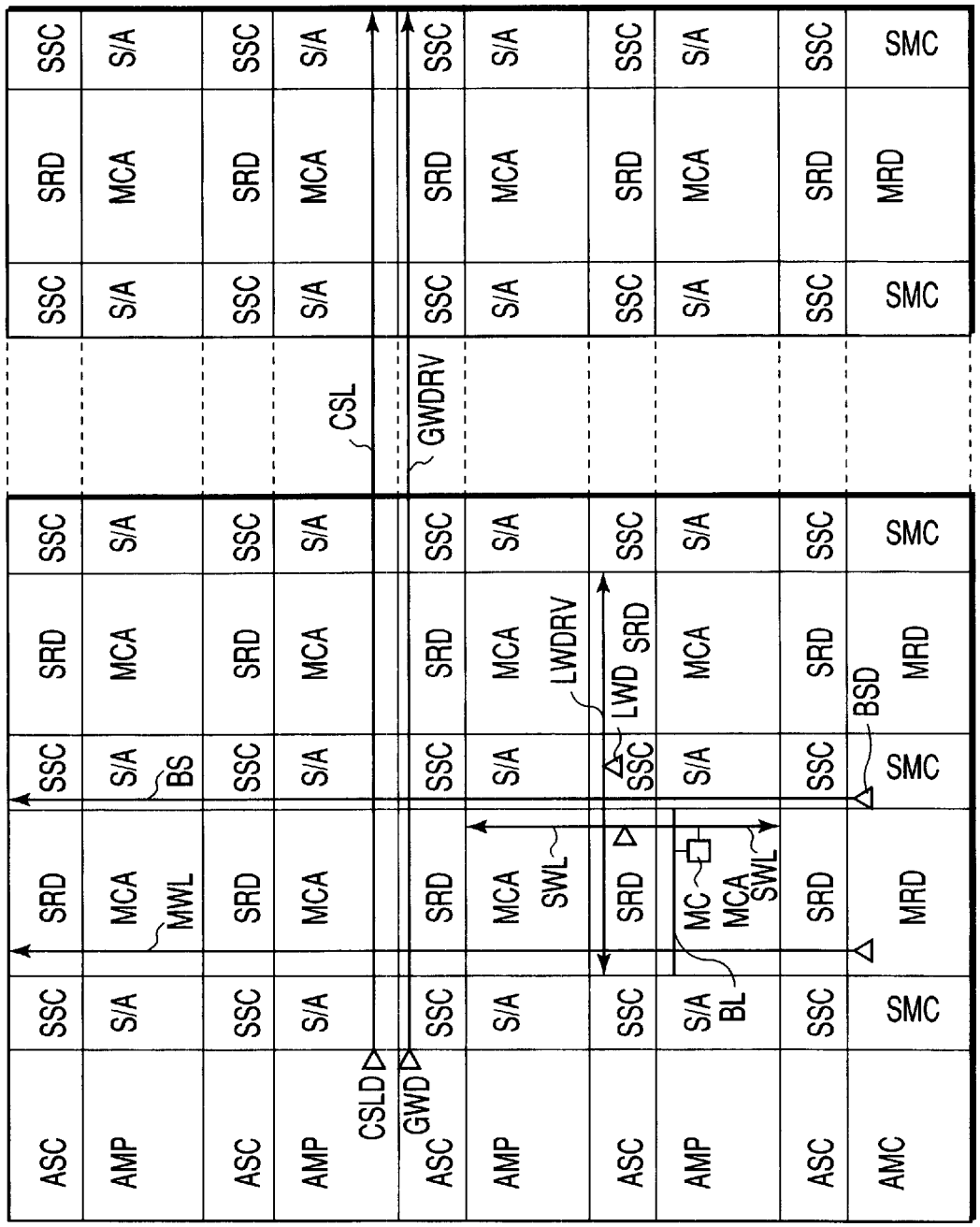
FIG. 11 is a schematic view illustrating an example of a core section incorporated in a DRAM using the NWR method.

FIGS. 8–10 illustrate a modification of the second embodiment. In FIGS. 2 and 8–10, like reference numerals denote like elements, and a description will be given of only different elements.

As described above, the main row decoders MRD are arranged one-dimensionally cyclically. To further reduce the required area of the main row decoders MRD, a method could be devised where the driving system for the main word lines MWL is arranged in stages by separating the third and fourth level shift circuits LS3 and LS4 shown in FIG. 6.

Specifically, the main row decoder MRD shown in FIGS. 8 and 9 includes the fourth level shift circuit LS4 shown in FIG. 6, as described later. The reset circuit RST shown in FIGS. 8 and 10 includes the third level shift circuit LS3 shown in FIG. 6, as described later. The reset circuit RST is provided, for example, outside the core circuit. The reset circuit RST is commonly used by a plurality of main row decoders MRD.

In accordance with a timing signal Ti and the address signal A4, the reset circuit RST outputs the control signal MWL_OFF as a reset signal. The control signal MWL_OFF is of the voltage Vpp or Vss.

In accordance with the address signal Add and the control signal MWL_OFF supplied from the reset circuit RST, the main row decoder MRD drives a corresponding main word line MWL.

FIG. 9 shows an example of the main row decoder MRD. In FIG. 9, reference numerals corresponding to those in FIG. 6 denote similar elements, and a description will be given of only different elements. Unlike the case of FIG. 6, the dynamic latch circuit DLT3 in FIG. 9 operates at the voltage Vpp or Vss. Similarly, unlike the case of FIG. 6, the fourth level shift circuit LS4 in FIG. 9 operates at the voltage Vpp or Vnn. The driving circuit DR4 operates at the voltage Vpp or Vnn.

FIG. 10 shows an example of the reset circuit RST. The timing signal Ti and address signal A4 are supplied to the input terminal of a NAND circuit ND1. The timing signal Ti and address signal A4 are of the voltage Vii or Vss. The output terminal of the NAND circuit ND1 is connected to the input terminal of the third level shift circuit LS3. The third level shift circuit LS3 operates at the voltage Vpp or Vss as in the case of FIG. 6. The output terminal of the third level shift circuit LS3 is connected to a driving circuit DR6. The driving circuit DR6 is formed of inverter circuits IV8 and IV9 connected in series. The inverter circuits IV8 and IV9 operate at the voltage Vpp or Vss. The driving circuit DR6 outputs the control signal MWL_OFF from its output terminal.

In the above configuration, the third level shift circuit LS3, which operates at the voltage Vpp or Vss, is separated from the main row decoder MRD and included in the reset circuit RST that is located outside the core circuit. Therefore, the main row decoder MRD can be formed of the dynamic latch circuit DLT3, the fourth level shift circuit LS4 and the driving circuit DR4. This can reduce the required area of the main row decoder MRD and hence further reduce the required size of the core circuit.

Moreover, the reset circuit RST includes the third level shift circuit LS3 that operates at the voltage Vpp or Vss, while the main row decoder MRD includes the fourth level shift circuit LS4 that operates at the voltage Vpp or Vnn. Accordingly, the address signal, which is supplied to the dynamic latch circuit DLT3 in the main row decoder MRD, can be maintained at Vii or Vss. Since the total length of the wiring, to which the address signal is applied, is long, a high-speed operation can be realized by keeping the address signal at Vii or Vss.

The present invention can be applied not only to DRAM, but also to another memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first circuit configured to generate a second signal in accordance with a first signal, the first signal having high and low levels set at first and second voltages, respectively, the second signal having high and low levels set at the first voltage and a third voltage lower than the second voltage, respectively; and
   a plurality of second circuits connected to the first circuit, each of the second circuits being configured to generate a third signal in accordance with the second signal output from the first circuit, the third signal having high and low levels set at a fourth voltage higher than the first voltage and the third voltage, respectively,
   wherein:
   the first circuit includes a first level shift circuit which converts the second voltage into the third voltage; and
   the second circuit includes a second level shift circuit which converts the first voltage into the fourth voltage.

2. The device according to claim 1, further comprising a plurality of third circuits connected to one of the second circuits and each configured to generate a fourth signal in accordance with the third signal output from the one of the second circuits, the fourth signal having high and low levels set at the fourth voltage and the third voltage, respectively.

3. The device according to claim 2, wherein the first circuit includes a plurality of first circuit components each provided for a plurality of memory cell arrays.

4. The device according to claim 2, wherein the first voltage is an internal power supply voltage, and the fourth voltage is a voltage obtained by boosting a power supply voltage.

5. The device according to claim 4, wherein the third voltage is a negative voltage.

6. The device according to claim 3, wherein each of the third circuits is a segment row decoder, each of the second circuits is a local word-drive-line driving circuit which drives a local word drive line, the first circuit is a global word-drive-line driving circuit, the first signal is an address signal, the second signal is a global word drive signal, the third signal is a local word drive signal, and the fourth signal is a segment word signal.

7. A semiconductor memory device comprising:
   a plurality of first word lines each connected to a plurality of memory cells;
   a first word-line-driving circuit connected to the first word lines to drive the first word lines;
   a second word line connected to the first word-line-driving circuit;
   a second word-line-driving circuit connected to the second word line;
   a first address signal supplied to the second word-drive-line driving circuit;
   a first word drive line connected to the first word-line-driving circuit;
   a second word drive line connected to the first word-line-driving circuit and complementary to the first word drive line;
   a first word-drive-line-driving circuit connected to the first and second word drive lines to drive the first and second word drive lines;
   a third word drive line connected to the first word-drive-line driving circuit;
   a second word-drive-line-driving circuit connected to the third word drive line to drive the third word drive line;
   a second address signal supplied to the second word-drive-line-driving circuit;
   a block select line connected to the first word-drive-line-driving circuit;
   a block-select-line-driving circuit connected to the block select line to drive the block select line; and
   a third address signal supplied to the block-select-line-driving circuit,
   wherein:
   the second word-drive-line-driving circuit generates a first signal in accordance with the second address signal to thereby drive the third word drive line, the second address signal having high and low levels set at first and second voltages, respectively, the first signal having high and low levels set at the first voltage and a third voltage lower than the second voltage, respectively;
   the block-select-line-driving circuit generates a second signal in accordance with the third address signal to thereby drive the block select line, the third address signal having high and low levels set at the first voltage and the second voltage, respectively, the second signal having high and low levels set at a fourth voltage higher than the first voltage and the third voltage, respectively;
   the first word-drive-line driving circuit generates third and fourth signals in accordance with the first signal supplied from the second word-drive-line-driving circuit via the third word drive line, and a level of the second signal supplied from the block-select-line-driving circuit via the block select line, thereby driving the first and second word drive lines, the third signal having high and low levels set at the fourth voltage and the third voltage, respectively, the fourth signal having high and low levels set at the first and third voltages, respectively;
   the second word-line-driving circuit generates a fifth signal in accordance with the first address signal to thereby drive the second word line, the first address signal having high and low levels set at the first and second voltages, respectively, the fifth signal having high and low levels set at the fourth and third voltages, respectively; and the first word-line-driving circuit generates a sixth signal in accordance with the third and fourth signals supplied from the first and second word drive lines, and the fifth signal supplied from the second word-line-driving circuit via the second word line, thereby driving the first word lines, the sixth signal having high and low levels set at the fourth voltage and the third voltage, respectively.

8. The device according to claim 7, wherein:

the first word-drive-line-driving circuit includes a first level shift circuit which shifts the first voltage to the fourth voltage, and shifts the second voltage to the third voltage;

the second word-drive-line-driving circuit includes a second level shift circuit which shifts the second voltage to the third voltage;

the second word-line-driving circuit includes a third level shift circuit which shifts the first voltage to the fourth voltage, and a fourth level shift circuit which shifts the second voltage to the third voltage;

the first word-line-driving circuit includes an inverter circuit which outputs one of the third and fourth voltages in accordance with the fifth signal supplied from the second word-line-driving circuit, and a transistor connected to an output terminal of the inverter circuit and configured to set a level of the output terminal of the inverter circuit to the third voltage in accordance with the fourth signal supplied to the second word drive line; and the block-select-line-driving circuit includes a fifth level shift circuit which shifts the first voltage to the fourth voltage, and a sixth level shift circuit which shifts the second voltage to the third voltage.

9. The device according to claim 7, further comprising a reset circuit connected to the second word-line-driving circuit, the reset circuit generating a reset signal in accordance with a reset timing signal and the first address signal.

10. The device according to claim 9, wherein the second word-line-driving circuit drives the second word line in accordance with the first address signal, and resets the second word line in accordance with the reset signal supplied from the reset circuit.

11. The device according to claim 9, wherein the reset circuit includes a seventh level shift circuit which shifts the first voltage to the fourth voltage.

12. The device according to claim 9, wherein the reset signal has high and low levels set at the fourth and the second voltages, respectively.

13. The device according to claim 11, wherein the first voltage is an internal power supply voltage, and the fourth voltage is a voltage obtained by boosting a power supply voltage.

14. The device according to claim 13, wherein the third voltage is a negative voltage.

15. A semiconductor memory device comprising:

a plurality of first word lines connected to a plurality of memory cells;

a plurality of first word-line-driving circuits connected to the respective first word lines;

a second word line connected to the first word-line-driving circuits;

a second word-line-driving circuit connected to the first word-line-driving circuits, and configured to drive the second word line in accordance with a first address signal;

a plurality of first and second word drive lines connected to the first word-line-driving circuits;

a plurality of first word-drive-line-driving circuits connected to the first and second word drive lines;

a third word drive line connected to the first word-drive-line-driving circuits;

a second word-drive-line-driving circuit connected to the third word drive line and configured to drive the third word drive line in accordance with a second address signal; and a block-select-line-driving circuit connected to the first word-drive-line-driving circuits and configured to drive the block select line in accordance with a third address signal, wherein:

the second word-drive-line-driving circuit generates a first signal in accordance with the second address signal to thereby drive the third word drive line, the second address signal having high and low levels set at first and second voltages, respectively, the first signal having high and low levels set at the first voltage and a third voltage lower than the second voltage, respectively;

the block-select-line-driving circuit generates a second signal in accordance with the third address signal to thereby drive the block select line, the third address signal having high and low levels set at the first and second voltages, respectively, the second signal having high and low levels set at a fourth voltage higher than the first voltage and the third voltage, respectively;

each of the first word-drive-line-driving circuits generates third and fourth signals in accordance with the first signal supplied from the second word-drive-line-driving circuit via the third word drive line, and a level of the second signal supplied from the block-select-line-driving circuit via the block select line, thereby driving the first and second word drive lines, the third signal having high and low levels set at the fourth voltage and the third voltage, respectively, the fourth signal having high and low levels set at the first and third voltages, respectively;

the second word-line-driving circuit generates a fifth signal in accordance with the first address signal to thereby drive the second word line, the first address signal having high and low levels set at the first and second voltages, respectively, the fifth signal having high and low levels set at the fourth and third voltages, respectively; and each of the first word-line-driving circuits generates a sixth signal in accordance with the third and fourth signals supplied from the first and second word drive lines, and the fifth signal supplied from the second word-line-driving circuit via the second word line, thereby driving the first word lines, the sixth signal having high and low levels set at the fourth voltage and the third voltage, respectively.

16. The device according to claim 15, wherein:

each of the first word-drive-line-driving circuits includes a first level shift circuit which shifts the first voltage to the fourth voltage, and shifts the second voltage to the third voltage;

the second word-drive-line-driving circuit includes a second level shift circuit which shifts the second voltage to the third voltage;

the second word-line-driving circuit includes a third level shift circuit which shifts the first voltage to the fourth voltage, and a fourth level shift circuit which shifts the second voltage to the third voltage;

each of the first word-line-driving circuits includes an inverter circuit which outputs one of the third and fourth voltages in accordance with the fifth signal supplied from the second word-line-driving circuit, and a transistor connected to an output terminal of the inverter circuit and configured to set a level of the output terminal of the inverter circuit to the third voltage in accordance with the fourth signal supplied to the second word drive line; and the block-select-line-driving circuit includes a fifth level shift circuit which shifts the first voltage to the fourth voltage, and a sixth level shift circuit which shifts the second voltage to the third voltage.

17. The device according to claim 16, further comprising a reset circuit connected to the second word-line-driving circuit, the reset circuit generating a reset signal in accordance with a reset timing signal and the first address signal.

18. The device according to claim 17, wherein the second word-line-driving circuit drives the second word line in accordance with the first address signal, and resets the second word line in accordance with the reset signal supplied from the reset circuit.

19. The device according to claim 17, wherein the reset circuit includes a seventh level shift circuit which shifts the first voltage to the fourth voltage.

20. The device according to claim 17, wherein the reset signal has high and low levels set at the fourth and second voltages, respectively.

21. The device according to claim 17, wherein the first and second word lines and the block select line are arranged in a single direction, and the first, second and third word drive lines are arranged in a single direction.

22. The device according to claim 19, wherein the first voltage is an internal power supply voltage, and the fourth voltage is a voltage obtained by boosting a power supply voltage.

23. The device according to claim 22, wherein the third voltage is a negative voltage.

* * * * *

UNITED STATES PATENT AND TRADEMARK OFFICE
CERTIFICATE OF CORRECTION

PATENT NO. : 6,650,590 B2
DATED : November 18, 2003
INVENTOR(S) : Tsuneo Inaba et al.

It is certified that error appears in the above-identified patent and that said Letters Patent is hereby corrected as shown below:

<u>Column 13,</u>
Line 48, "the" has been removed.

Signed and Sealed this

Twenty-fourth Day of February, 2004

JON W. DUDAS
*Acting Director of the United States Patent and Trademark Office*